(12) United States Patent
Moriya et al.

(10) Patent No.: US 8,132,580 B2
(45) Date of Patent: Mar. 13, 2012

(54) SUBSTRATE PROCESSING SYSTEM AND SUBSTRATE CLEANING APPARATUS INCLUDING A JETTING APPARATUS

(75) Inventors: Tsuyoshi Moriya, Nirasaki (JP); Tadashi Onishi, Nirasaki (JP); Ryo Nonaka, Nirasaki (JP); Eiichi Nishimura, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 442 days.

(21) Appl. No.: 12/057,807

(22) Filed: Mar. 28, 2008

(65) Prior Publication Data

US 2008/0236634 A1 Oct. 2, 2008

Related U.S. Application Data

(60) Provisional application No. 60/947,552, filed on Jul. 2, 2007.

(30) Foreign Application Priority Data

Mar. 29, 2007 (JP) ................. 2007-089803

(51) Int. Cl.
*B08B 3/00* (2006.01)
(52) U.S. Cl. .................... 134/102.1; 134/95.3
(58) Field of Classification Search ............... 134/95.3, 134/102.1
See application file for complete search history.

(56) References Cited

U.S. PATENT DOCUMENTS

| | | | | |
|---|---|---|---|---|
| 5,756,155 A | * | 5/1998 | Tzeng et al. | 427/294 |
| 5,967,156 A | * | 10/1999 | Rose et al. | 134/7 |
| 6,174,371 B1 | | 1/2001 | Iseki et al. | |
| 6,598,805 B2 | * | 7/2003 | Hirae et al. | 239/128 |
| 6,842,932 B2 | * | 1/2005 | Ishihara | 15/77 |
| 2003/0010353 A1 | | 1/2003 | Kawasaki et al. | |
| 2004/0018803 A1 | * | 1/2004 | Boumerzoug et al. | 451/39 |
| 2004/0055621 A1 | * | 3/2004 | McDermott et al. | 134/1.3 |
| 2004/0261817 A1 | * | 12/2004 | Araki et al. | 134/2 |
| 2006/0102207 A1 | * | 5/2006 | Moriya | 134/34 |

FOREIGN PATENT DOCUMENTS

| | | |
|---|---|---|
| CN | 1575870 A | 2/2005 |
| CN | 1930666 A | 3/2007 |
| JP | 4-14222 | 1/1992 |
| JP | 4-245627 | 9/1992 |
| JP | 8-195377 | 7/1996 |
| JP | 9-141191 | 6/1997 |
| JP | 09141191 A * | 6/1997 |

(Continued)

OTHER PUBLICATIONS

Office Action issued Jul. 26, 2011, in Chinese Patent Application No. 200810086918.7 with English translation.

(Continued)

*Primary Examiner* — Michael Barr
*Assistant Examiner* — Charles W Kling
(74) *Attorney, Agent, or Firm* — Oblon, Spivak, McClelland, Maier & Neustadt, L.L.P.

(57) ABSTRACT

A substrate processing system that enables foreign matter adhered to a rear surface or a periphery of a substrate to be completely removed. A substrate processing apparatus performs predetermined processing on the substrate. A substrate cleaning apparatus cleans the substrate at least one of before and after the predetermined processing. A jetting apparatus jets a cleaning substance in two phases of a gas phase and a liquid phase and a high-temperature gas towards the rear surface or the periphery of the substrate.

20 Claims, 10 Drawing Sheets

FOREIGN PATENT DOCUMENTS

| | | |
|---|---|---|
| JP | 11-121338 | 4/1999 |
| JP | 2001-277116 | 10/2001 |
| JP | 2002-93766 | 3/2002 |
| JP | 2002-355619 | 12/2002 |
| JP | 2003-264168 | 9/2003 |
| JP | 2004-327674 | 11/2004 |
| JP | 2005-039205 | 2/2005 |
| JP | 2006-147654 | 6/2006 |
| JP | 2007-027270 | 2/2007 |
| KR | 2003-0006972 | 1/2003 |

OTHER PUBLICATIONS

Japanese Office Action mailed on Sep. 13, 2011 issued for JP Application No. 2007-089803, filed on Mar. 29, 2007 (with English Translation).

* cited by examiner

SUBSTRATE PROCESSING SYSTEM AND SUBSTRATE CLEANING APPARATUS INCLUDING A JETTING APPARATUS

BACKGROUND OF THE INVENTION

1. Field of the Invention

The present invention relates to a substrate processing system and a substrate cleaning apparatus, and to a substrate processing system including the substrate cleaning apparatus for removing foreign matter adhering to a rear surface or a periphery of the substrate.

2. Description of the Related Art

Conventionally, in a substrate processing apparatus for performing predetermined processing on a substrate which is a semiconductor wafer (hereinafter referred to simply as "wafer"), pieces of metal, such as metal pieces of aluminum, resulting from contact between the wafer and a mounting stage on which the wafer is mounted, and reaction products, such as fluorocarbon-based polymers or the like, resulting from processing gas reactions are generated. The foreign matter (particles) adheres to the wafer, thereby reducing the quality of a semiconductor device formed on a surface of the wafer.

As a method for removing particles adhered to the wafer, a wet cleaning method is known in which a wafer that has undergone etching processing is cleaned using a hydrofluoric acid solution or pure water in a wet processing chamber (see, for instance, Japanese Laid-Open Patent Publication (kokai) No. H4-14222). In another known method, a plurality of wafers is cleaned by immersion processing in a cleaning tank filled with a cleaning solution such as an ammonia solution or a hydrofluoric acid solution or the like. According to these methods, it is possible to remove particles which have adhered to the wafers during etching processing.

However, since the above-described wet cleaning method mainly involve spraying pure water or the like towards a front surface of the wafer, particles adhering to the rear surface and bevel polymer adhering to the periphery (bevel portion) of the wafer cannot be removed.

Since the particles adhering to the rear surface of the wafer cause the wafer to rise when the wafer is mounted on the mounting stage, when a photoresist applied on the front surface of the wafer is exposed in a lithography process, the focus position fails to match the photoresist position, and the exposure cannot be accurately performed. Moreover, when the wafer is moved at the front of a lens in an immersion lithography apparatus, the bevel polymer at the periphery of the wafer passes through ultra pure water that exists between the wafer and the lens. At this point, the bevel polymer can, on occasion, detach and mix with the ultra pure water, the detached bevel polymer blocks light, and hence the exposure cannot be accurately performed. Also, a residual photoresist formed prior to the lithography process may be left on the periphery of the wafer, and mix with the ultra pure water in the same way as the bevel polymer. Consequently, there is a problem of reducing the quality of the semiconductor device manufactured from the wafer.

The wafers which have undergone the etching processing are transferred in a sealed vessel such as a FOUP (Front Opening Unified Pod) which holds the plurality of wafers in parallel with one another. However, there is a problem in that foreign matter (particles, polymer) detaches from rear surfaces or periphery of upper wafers in the FOUP, and drops and adheres to the front surfaces of lower wafers. This causes a problem of reducing, the quality of semiconductor devices manufactured from the lower wafers.

In the above-described method for immersing a plurality of wafers in the cleaning tank, it is possible to remove not only the particles on the front surface of a wafer, but also the particles on the rear surface of the wafer and the bevel polymer on the periphery of the wafer. However, there is a problem in that the removed particles remain in the cleaning solution and may therefore re-adhere to the wafers (cross-contamination), causing a problem of reducing the quality of semiconductor devices.

There is a further problem with the above-described wet cleaning method in that, since the flow of pure water in the wet cleaning is not controlled, even if the particles on the rear surface of a wafer and the bevel polymer are removed, the removed particles and bevel polymer re-adhere to the front surface of adjacent wafers, for instance the surface of wafers being simultaneously cleaned, the removed particles and bevel polymer thus causing reduction of the quality of semiconductor devices.

SUMMARY OF THE INVENTION

The present invention provides a substrate processing system and a substrate cleaning apparatus capable of completely removing foreign matter adhered to a rear surface or a periphery of a substrate.

Accordingly, in a first aspect of the present invention, there is provided a substrate processing system comprising a substrate processing apparatus configured to perform predetermined processing on a substrate, and a substrate cleaning apparatus configured to clean the substrate at least one of before and after the predetermined processing, wherein the substrate cleaning apparatus includes a jetting apparatus configured to jet a cleaning substance in two phases of a gas phase and a liquid phase, and a high-temperature gas towards a rear surface or a periphery of the substrate.

According to the first aspect of the present invention, the cleaning substance in the two phases of the gas phase and the liquid phase, and the high-temperature gas are jetted towards the rear surface or the periphery of the substrate. The high-temperature gas removes comparatively large foreign matter adhered to the rear surface or the periphery of the substrate using a thermal stress or viscous force. Further, although a boundary layer in which the high-temperature gas does not flow is generated at the rear surface or the periphery of the substrate by the jetted high-temperature gas, the liquid phase cleaning substance enters the boundary layer and adheres around the comparatively small foreign matter within the boundary layer. When the cleaning substance adheres around the foreign matter, an attractive force such as the Van der Waal's force between the foreign matter and the substrate is reduced. Moreover, the liquid phase cleaning substance entering the boundary layer collides with and thereby applies a physical shock to the foreign matter. As a result, the comparatively small foreign matter is removed. Hence, it is possible to completely remove the foreign matter adhered to the rear surface or the periphery of the substrate.

The first aspect of the present invention can provide a substrate processing system, wherein the jetting apparatus jets the cleaning substance and the high-temperature gas diagonally with respect to the rear surface of the substrate.

According to the first aspect of the present invention, the cleaning substance and the high-temperature gas are jetted diagonally with respect to the rear surface of the substrate. Since the diagonally jetted cleaning substance and high-temperature gas push the boundary layer along the rear surface of the substrate, it is possible to expose the comparatively small foreign matter from the boundary layer. Hence, it is possible to reliably remove the comparatively small foreign matter adhered to the rear surface of the substrate.

The first aspect of the present invention can provide a substrate processing system, wherein the jetting apparatus and the substrate move in parallel relative to each other.

According to the first aspect of the present invention, since the jetting apparatus and the substrate move in parallel relative to each other, the foreign matter removed from the rear surface or the periphery of the substrate is never pressed against the rear surface and the periphery of the substrate again, the foreign matter carried by the flow of the high-temperature gas jetted towards the rear surface or the periphery of the substrate. Hence it is possible to prevent the foreign matter from re-adhering to the rear surface or the periphery of the substrate.

The first aspect of the present invention can provide a substrate processing system, wherein the jetting apparatus includes an intake duct portion that opens towards the rear surface of the substrate.

According to the first aspect of the present embodiment, the intake duct portion opens towards the rear surface of the substrate, and the foreign matter removed from the rear surface of the substrate is therefore sucked in and reliably prevented from re-adhering to the rear surface of the substrate.

The first aspect of the present invention can provide a substrate processing system, wherein the substrate cleaning apparatus has another jetting apparatus configured to jet another gas towards a front surface of the substrate.

According to the first aspect of the present invention, the other gas is jetted towards the front surface of the substrate, and it is therefore possible to prevent the substrate from being moved by the cleaning substance and the high-temperature gas jetted towards the rear surface or the periphery of the substrate. Further, it is possible to prevent the foreign matter removed from the rear surface or the periphery of the substrate from moving around the front surface of the substrate and adhering to the front surface.

The first aspect of the present invention can provide a substrate processing system, wherein the substrate cleaning apparatus includes a holding apparatus configured to hold the substrate.

According to the first aspect of the present invention, the substrate is held, and it is therefore possible to reliably prevent the substrate from being moved by the cleaning substance and the high-temperature gas jetted towards the rear surface or the periphery of the substrate.

The first aspect of the present invention can provide a substrate processing system, wherein the holding apparatus turns the substrate over.

According to the first aspect of the present invention, the substrate can be turned over, and foreign matter can therefore be removed not only from the rear surface of the substrate but also from the front surface of the substrate using the jetted cleaning substance and high-temperature gas.

The first aspect of the present invention can provide a substrate processing system, wherein the substrate cleaning apparatus includes a vibration applying apparatus configured to apply a vibration to the holding apparatus.

According to the first aspect of the present invention, the vibration is applied to the holding apparatus which holds the substrate, and it is therefore possible to cause the substrate to vibrate. Hence it is possible to promote the removal of the foreign matter.

The first aspect of the present invention can provide a substrate processing system, wherein the substrate cleaning apparatus includes another vibration applying apparatus configured to apply a vibration to the cleaning substance and the high-temperature gas.

According to the first aspect of the present invention, the vibration is applied to the cleaning substance and the high-temperature gas jetted towards the rear surface or the periphery of the substrate, and it is therefore possible to increase the physical shock applied to the foreign matter by the cleaning substance and the high-temperature gas. As a result, it is possible to promote the removal of the foreign matter.

The first aspect of the present invention can provide a substrate processing system, wherein the substrate cleaning apparatus includes a flow rate fluctuating apparatus configured to cause fluctuation like pulse waves in flow rates of the cleaning substance and the high-temperature gas.

According to the first aspect of the present invention, the flow rates of the cleaning substance and the high-temperature gas is fluctuated like pulse waves, and it is therefore possible to cause pressure fluctuation in the cleaning substance and the high-temperature gas. Hence, the physical shock applied to the foreign matter by the cleaning substance and the high-temperature gas can be increased. As a result, it is possible to promote the removal of the foreign matter.

The first aspect of the present invention can provide a substrate processing system, wherein the cleaning substance is one selected from the group consisting of water, organic solvents, surfactants, and cleaning solutions.

According to the first aspect of the present invention, the cleaning substance jetted towards the rear surface or the periphery of the substrate is one selected from the group consisting of water, organic solvents, surfactants, and cleaning solutions. Since the boiling points of these cleaning substances are comparatively low, they can easily be in two phases of the gas phase and the liquid phase. Also, since these cleaning materials adhere easily to the foreign matter, it is possible to reliably reduce the attractive force between the foreign matter and the substrate.

The first aspect of the present invention can provide a substrate processing system, wherein the predetermined processing is etching processing.

According to the first aspect of the present invention, the predetermined processing performed at least one of before and after cleaning the substrate is etching processing. Completely removing the foreign matter adhered to the rear surface or the periphery of the substrate, it is thus possible to prevent the foreign matter from entering the substrate processing apparatus when the substrate is transferred into the substrate processing apparatus which performs the etching processing, and prevent foreign matter, which results from reaction products or polymers generated in the etching process, from entering other substrate processing apparatuses.

The first aspect of the present invention can provide a substrate processing system, wherein the predetermined processing is lithography processing of a photoresist or coater/developer processing.

According to the first aspect of the present invention, the predetermined processing performed at least one of before and after the cleaning of the substrate is lithography processing on the photoresist or coater/developer processing. Since the foreign matter adhered to the rear surface or the periphery of the substrate can be completely removed, the substrate can be prevented from rising in an immersion lithography apparatus and the foreign matter can be prevented from entering the ultra pure water of the immersion lithography apparatus. As a result, it is possible to accurately perform the lithography.

The first aspect of the present invention can provide a substrate processing system, wherein a temperature of the high-temperature gas is from 80° C. to 150° C.

Accordingly, the second aspect of the present invention can provide a substrate processing system comprising a substrate processing apparatus configured to perform predetermined processing on a substrate, and a substrate cleaning apparatus configured to clean the substrate at least one of before and after the predetermined processing, wherein the substrate cleaning apparatus includes a jetting apparatus configured to jet a cleaning substance in a gas phase and a high-temperature gas towards a rear surface or a periphery of the substrate, and the cleaning substance in the gas phase includes clustered molecules or atoms.

According to the second aspect of the present invention, the gas phase cleaning substance and the high temperature gas are jetted towards the rear surface or the periphery of the substrate, and the gas phase cleaning substance includes clustered molecules or atoms. The high temperature gas removes comparatively large foreign matter adhered to the rear surface or the periphery of the substrate using the thermal stress or viscous force. Further, although a boundary layer in which the high temperature gas does not flow is generated at the rear surface or the periphery of the substrate by the jetted high temperature gas, the clustered molecules or atoms enter the boundary layer and molecule or atom units adhere around the comparatively small foreign matter in the boundary layer. When the molecules or atoms adhere around the foreign matter, the attractive force such as the Van der Waal's force between the foreign matter and the substrate is reduced. Further, the clustered molecules or atoms entering the boundary layer collide with and thereby apply a physical shock to the foreign matter. As a result, the comparatively small foreign matter is also removed. Hence, it is possible to completely remove the foreign matter adhered to the rear surface or the periphery of the substrate.

Accordingly, the third aspect of the present invention can provide a substrate cleaning apparatus comprising a jetting apparatus configured to jet a cleaning substance in two phases of a gas phase and a liquid phase and a high-temperature gas towards a rear surface or a periphery of a substrate.

Accordingly, the fourth aspect of the present invention can provide a substrate cleaning apparatus comprising a jetting apparatus configured to jet a cleaning substance in a gas phase and a high-temperature gas towards a rear surface or a periphery of the substrate, wherein the cleaning substance in the gas phase includes clustered molecules or atoms.

The features and advantages of the invention will become more apparent from the following detailed description taken in conjunction with the accompanying drawings.

DETAILED DESCRIPTION OF THE PREFERRED EMBODIMENTS

The following describes embodiments of the present invention with reference to the drawings.

First, a substrate processing system according to a first embodiment of the present invention is described.

Figure 1:
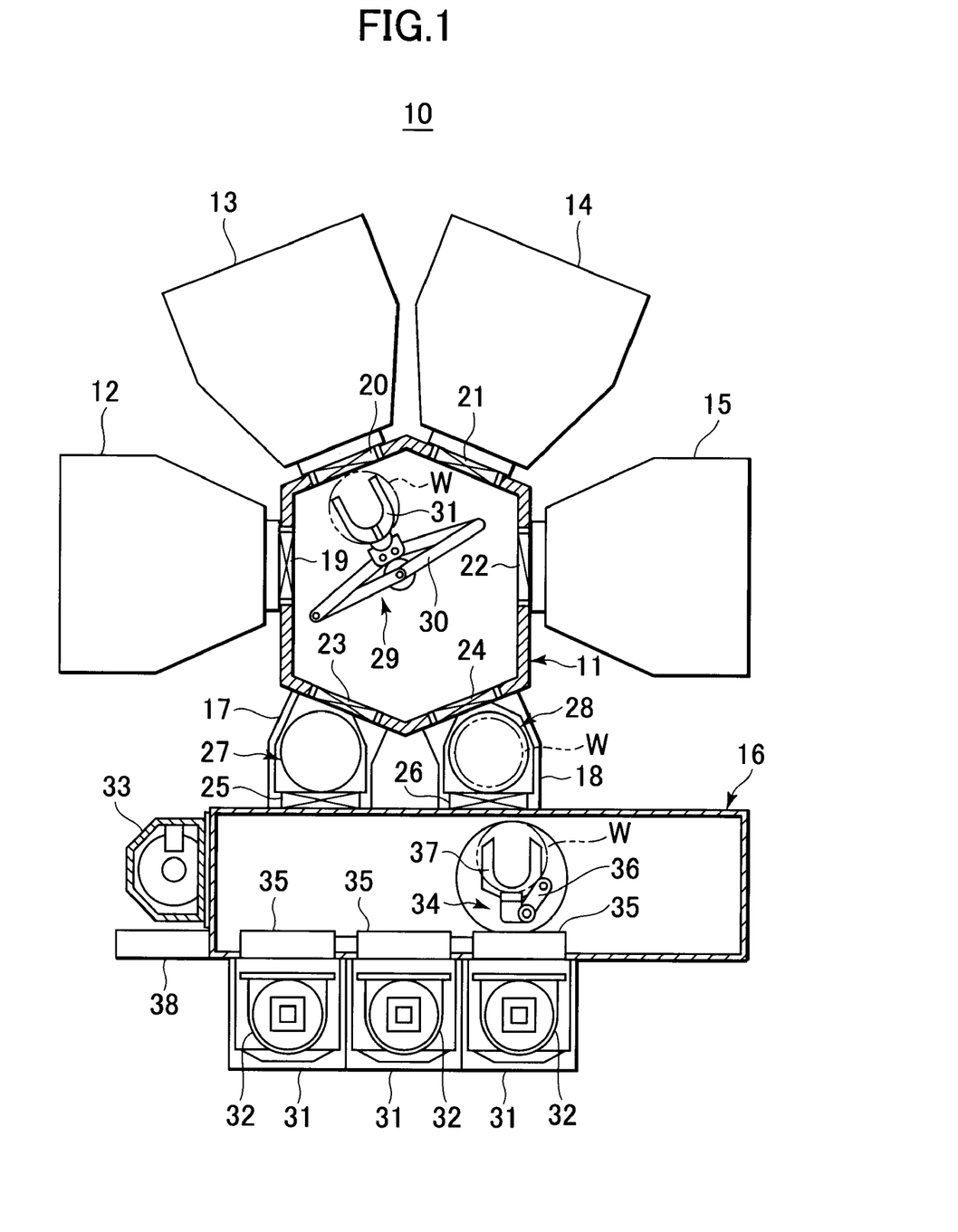
FIG. 1 is a plan view schematically showing a construction of a substrate processing system according to a first embodiment of the present invention.

FIG. 1 is a plan view schematically showing a construction of the substrate processing system according to the present embodiment.

The substrate processing system 10 in FIG. 1 includes a transfer module 11 that is hexagonal in plan view, four process modules 12 to 15 radially arranged around the transfer module 11, a loader module 16 which is a common rectangular transfer chamber, and two load-lock modules 17 and 18 arranged between the transfer module 11 and the loader module 16 so as to couple the transfer module 11 and the loader module 16.

Each of the process modules 12 to 15 is a substrate processing apparatus performing predetermined processing on a semiconductor device-use wafer (hereinafter referred to simply as "wafer") W. For instance, the process module 12 is an etching processing apparatus for performing etching processing on the wafer W using plasma, and the process module 15 is a substrate cleaning apparatus for performing cleaning processing on a rear surface or a periphery of the wafer W.

In the substrate processing system 10, the transfer module 11 and the process modules 12 to 15 have inner pressures maintained under vacuum, and the transfer module 11 is connected to each of the process modules 12 to 15 via corresponding vacuum gate valves 19 to 22. The interior of the loader module 16 is maintained at atmospheric pressure, while the interior of the transfer module 11 is maintained under vacuum. Thus, the load-lock modules 17 and 18 have vacuum gate valves 23 and 24 at respective joints with the transfer module 11, and have atmosphere door valves 25 and 26 at respective joints with the loader module 16, so that the load-lock modules 17 and 18 form vacuum preliminary transfer chambers having controllable internal pressures. The load-lock modules 17 and 18 also have wafer mounting stages 27 and 28, respectively, on which wafers W transferred between the loader module 16 and the transfer module 11 are temporarily mounted.

The transfer module 11 includes a substrate transfer unit 29 of a frog leg type arranged therein and configured to be bendable, extendable and pivotally movable. The substrate transfer unit 29 has a horizontally extendable and freely rotatable arm 30 and a two-pronged transfer fork 31 which is connected to a distal end part of the arm 30 and supports the wafer W. The substrate transfer unit 29 transfers the wafer W between the process modules 12 to 15 and between the load-lock modules 17 and 18.

Besides being connected to the above-described load-lock modules 17 and 18, the loader module 16 is connected to three FOUP (Front Opening Unified Pod) mounting stages 31 on which respective FOUPs 32 are mounted as containers, each housing 25 wafers, and to an orienter 33 for pre-aligning the position of each wafer W transferred from the FOUPs 32.

The loader module 16 has a substrate transfer unit 34 arranged therein for transferring the wafer W, and three load ports 35 through which the wafers W enter and which are arranged in sidewalls of the loader module 16 so as to correspond to the respective FOUP mounting stages 31. The substrate transfer unit 34 includes a horizontally extendable and freely rotatable arm 36, and a two-pronged transfer fork 37 which is connected to the distal end part of the arm 36 and supports the wafer W. By causing the arm 36 to extend, constrict and rotate, the substrate transfer unit 34 moves the transfer fork 37 supporting the wafer W to a desired position, thereby transferring the wafer W to the desired position. Specifically, the substrate transfer unit 34 removes the wafer W via the load port 35 from a FOUP 32 mounted on the FOUP mounting stage 31, and transfers the removed wafer W to the load-lock module 17 or 18 or to the orienter 33.

Further, the substrate processing system 10 includes a system controller (not shown) for controlling operations of the components, and an operation panel 38 arranged at one end of the loader module 16 with respect to a longitudinal direction. The system controller controls operations of each component in accordance with programs for the various processing. The operation panel 38 displays operation states of the components, and receives input operations from an operator.

Figure 2:
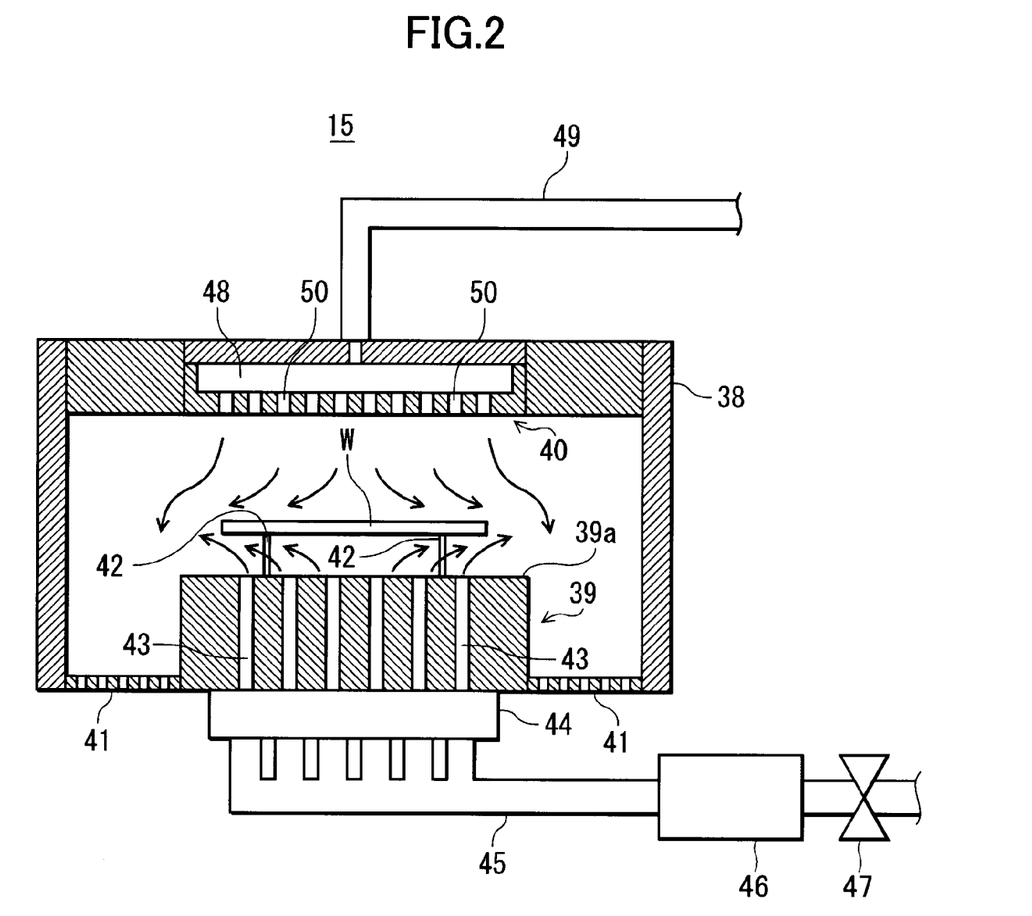
FIG. 2 is a cross-sectional view schematically showing a construction of a process module used as the substrate cleaning apparatus in FIG. 1.

FIG. 2 is a cross-sectional view schematically showing a construction of a process module which is the substrate cleaning apparatus in FIG. 1.

In FIG. 2, the process module 15 includes a chamber 38 housing the wafer W, a stage 39 for mounting the wafer W arranged on a bottom portion of the chamber 38, a shower head 40 arranged on a ceiling portion of the chamber 38 and opposing the stage 39, and an exhaust opening 41 for exhausting gas from inside the chamber 38.

The stage 39 has a plurality of pusher pins 42 capable of projecting from an upper surface 39a, and a plurality of cleaning agent jetting holes 43 which pierce the stage 39 and open in the upper surface 39a. The cleaning agent jetting holes 43 communicate with a cleaning agent supply pipe 45 via a cleaning agent vibration applying apparatus 44 (another vibration applying apparatus), and the cleaning agent supply pipe 45 is connected to a cleaning agent supplying apparatus (not shown) via a pulse generator 47 (flow rate fluctuating apparatus) that includes a heater 46 and a valve.

The shower head 40 has a buffer chamber 48 therein. The buffer chamber 48 communicates with a down-flow gas supplying pipe 49, and the down-flow gas supplying pipe 49 is connected to a down-flow gas supplying apparatus (not shown). The buffer chamber 48 communicates with the interior of chamber 38 via a plurality of through holes 50.

In the process module 15, the wafer W transferred into the chamber 38 is mounted on the upper surface 39a of the stage 39 so that a rear surface of the wafer W faces the upper surface 39a, and the pusher pins 42 support the wafer W so that the wafer is apart from the upper surface 39a.

The cleaning agent supplying apparatus supplies a cleaning agent which is a mixture of a cleaning material, such as pure water in the two phases of a liquid phase and a gas phase (hereinafter referred to simply as "two-phase") and an inert gas such as nitrogen gas to the cleaning agent jetting holes 43 via the heater 46, the cleaning agent supply pipe 45, and the cleaning agent vibration applying apparatus 44. The cleaning agent jetting holes 43 jet the supplied cleaning agent towards the rear surface or the periphery of the wafer W. Consequently, the stage 39 functions as a cleaning agent jetting apparatus.

Figure 3:
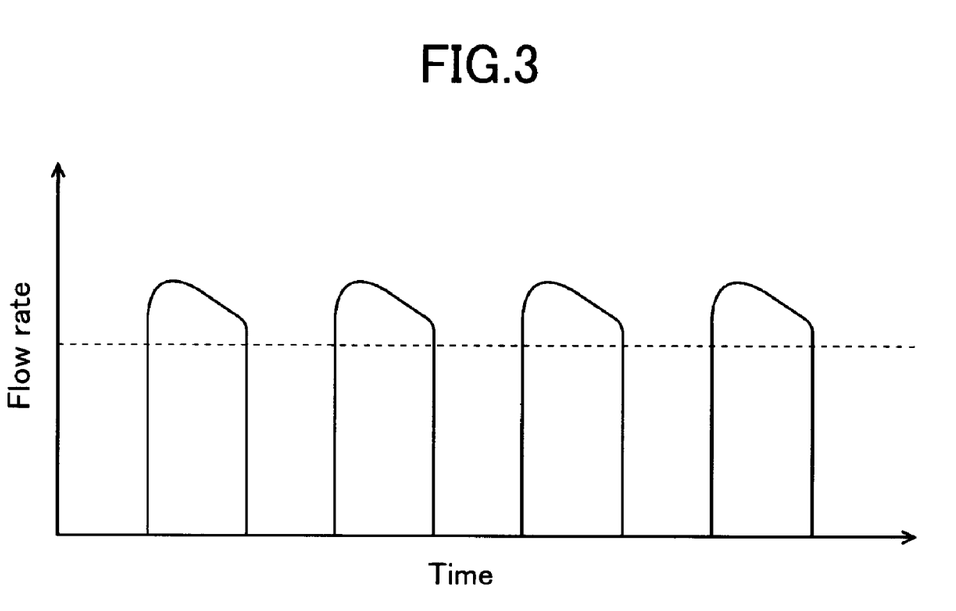
FIG. 3 is a plot showing a fluctuation like pulse waves in a flow rate of a cleaning agent.

Here, the heater 46 heats the cleaning agent, in particular, the nitrogen gas, and the cleaning agent vibration applying apparatus 44 applies an ultrasound vibration to the cleaning agent. The pulse generator 47 causes pressure fluctuation like pulse waves in a flow rate of the cleaning agent by opening and closing the valve, as shown in FIG. 3. In other words, pressure fluctuation like pulse waves is generated in the cleaning agent. Thus, the cleaning agent jetted from the cleaning agent jetting holes 43 towards the rear surface or the periphery of the wafer W includes two-phase pure water and a high-temperature nitrogen gas (high-temperature gas) that vibrate ultrasonically and fluctuate in pressure like pulse waves. Note that the temperature of the high-temperature gas is preferably from 80° C. to 150° C.

Figure 4A:
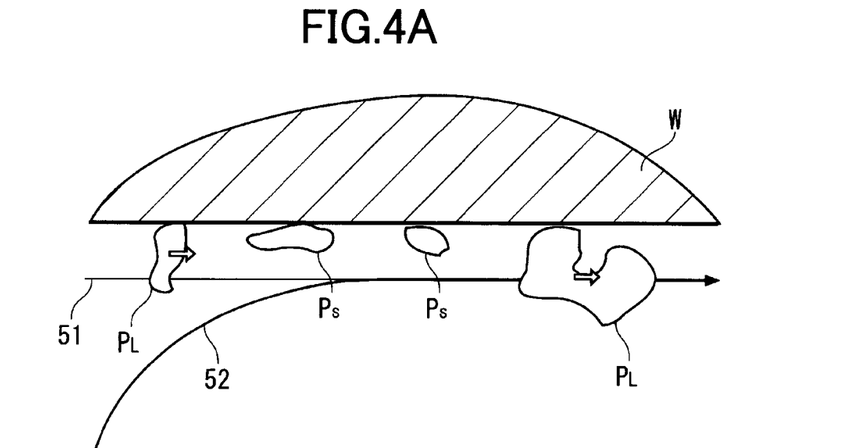
FIGS. 4A to 4C are views for describing removal of foreign matter according to a present embodiment, FIG. 4A showing a case in which only gas are jetted as the cleaning agent, FIG. 4B showing a case in which two-phase pure water and a high-temperature nitrogen gas are jetted as the cleaning agent, and FIG. 4C showing a manner in which comparatively small foreign matter is removed in the case of FIG. 4B.

Generally, foreign matter composed of particles, polymer or the like adheres to the rear surface and the periphery of the wafer W which has undergone the etching processing. The foreign matter is of various sizes. When a gas is jetted towards the rear surface or the periphery of the wafer W, a boundary layer 51 is generated at the rear surface or the periphery of the wafer W (FIG. 4A). Almost no gas flows in the boundary layer 51. Here, a portion of comparatively large foreign matter $P_L$ protrudes from the boundary layer 51, and therefore makes contact with a gas 52 and is subject to a viscous force of the gas 52. As a result, the comparatively large foreign matter $P_L$ detaches from the rear surface or the periphery of the wafer W. On the other hand, since comparatively small foreign matter $P_S$ does not protrude from the boundary layer 51, the comparatively small foreign matter $P_S$ is not subject to the viscous force of the gas 52 and does not detach from the rear surface or the periphery of the wafer W.

Figure 4B:
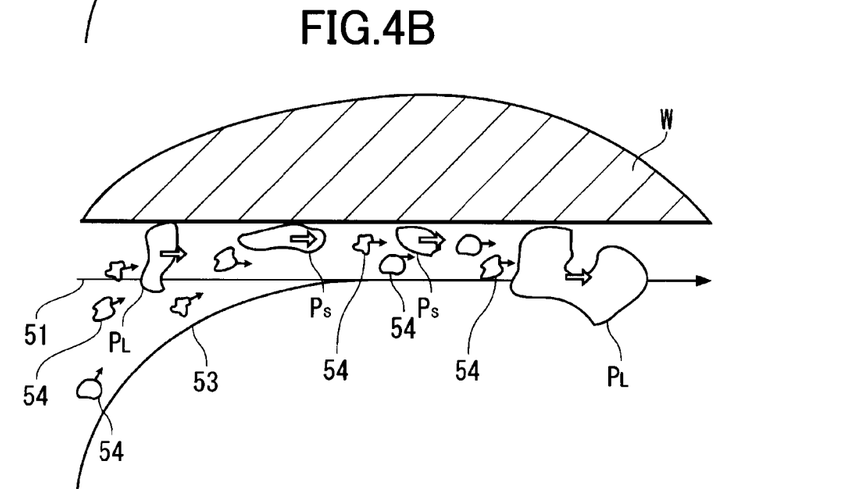

To deal with this, the stage 39 in the process module 15 jets the cleaning agent, which is comprised of the two-phase pure water and the high-temperature nitrogen gas, towards the rear surface or the periphery of the wafer W where the foreign matter is adhered. At this point, the jetted high-temperature nitrogen gas 53 generates the boundary layer 51 at the rear surface or the periphery of the wafer W, and the jetted high-temperature nitrogen gas 53 removes the comparatively large foreign matter $P_L$ having a portion protruding from the boundary layer 51 by the thermal stress and the viscous force. Since liquids are able to enter the boundary layer, the liquid phase of the jetted two-phase pure water 54 enters the boundary layer 51 (FIG. 4B).

Figure 4C:
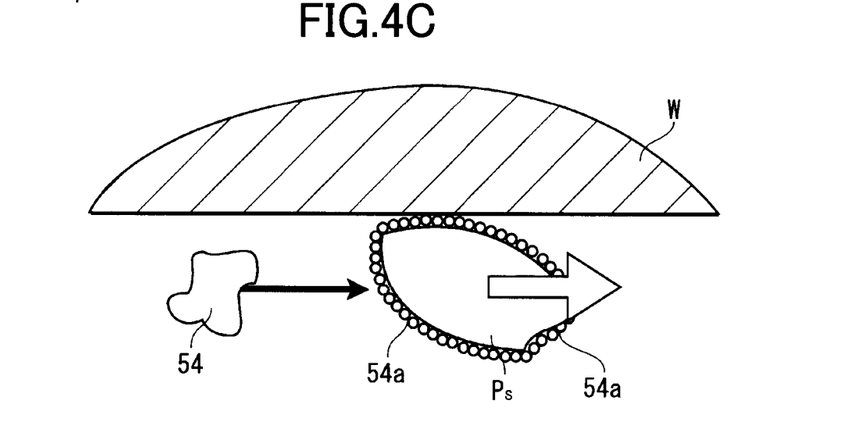

A portion of the pure water 54 which has entered the boundary layer 51 forms a large number of fine pure water particles 54a adhering around the comparatively small foreign matter $P_S$ that does not protrude from the boundary layer 51 (FIG. 4C). When the pure water particles 54a adhere without interval around the foreign matter $P_S$, the attractive force, such as the Van der Waal's Force, between the atoms and molecules making up the wafers W and the atoms and molecules making up the foreign matter $P_S$ is reduced. As a result, it becomes easier to detach the foreign matter $P_S$ from the rear surface or the periphery of the wafer W. Of the pure water 54 which enters the boundary layer 51, the portion not forming the fine pure water particles 54a collides with the foreign matter $P_S$ and thereby applies a physical shock to the foreign matter $P_S$. With this arrangement, it is possible to remove not only the comparatively large foreign matter $P_L$ protruding from the boundary layer 51, but also the comparatively small foreign matter $P_S$ not protruding from the boundary layer 51. Hence, it is possible to completely remove the foreign matter adhered to the rear surface or the periphery of the wafer W.

It is to be noted that a gas convection is generated in the boundary layer 51 although it is slight. Hence, even when the collision with the pure water 54 does not occur, the foreign matter $P_S$ covered without interval by the adhering pure water particles 54a is moved by the convection, and removed.

If the pure water 54 adheres the rear surface or the periphery of the wafer W and is allowed to evaporate over an extended period, there is a risk that watermarks will be generated. Here, however, the high-temperature nitrogen gas 53 is blown at the rear surface or the periphery of the wafer W, and any pure water 54 adhering to the rear surface or the periphery of the wafer W evaporates immediately. Hence, no watermarks will be generated on the rear surface or the periphery of the wafer W.

Since in the process module 15 the cleaning agent jetted towards the rear surface or the periphery of the wafer W vibrates ultrasonically and fluctuates in pressure like pulse waves, it is possible to increase the physical shock imparted on the foreign matter by the pure water 54. Consequently, the removal of the foreign matter from the rear surface or the periphery of the wafer W can be promoted. Moreover, the cleaning agent, in particular, the high-temperature nitrogen gas fluctuates in pressure like pulse waves, the thickness of the boundary layer 51 also fluctuates in response to the pressure fluctuation. Since the fluctuation in the thickness of the boundary layer 51 applies a vibration to the foreign matter, this also promotes the removal of the foreign matter.

Referring again to FIG. 2, the down-flow gas supplying apparatus supplies another inert gas, such as argon gas, to the buffer chamber 48 of the shower head 40 via a down-flow gas supplying pipe 49. The buffer chamber 48 jets the supplied argon gas into the chamber 38, and in particular towards a front surface of the wafer W via the plurality of through holes 50. This generates a down-flow towards the front surface of the wafer W in the chamber 38. Hence, the shower head 40 functions as a down-flow jetting apparatus (another jetting apparatus). The down-flow generated in the chamber 38 flows from the front surface of the wafer W to the edge of the stage 39, and is exhausted through the exhaust opening 41.

In the process module 15, the flow amount of the down-flow from the shower head 40 is set to be larger than the flow amount of the cleaning agent jetted from the stage 39. Hence, it is possible to prevent the flow of the cleaning agent that includes the foreign matter removed from the rear surface or the periphery of the wafer W from moving around to the front surface of the wafer W, and consequently, to prevent the foreign matter from adhering to the front surface of the wafer W. Further, it is possible to prevent the wafer W from being moved, upwards from the pusher pins 42 for instance, by the cleaning agent jetted from the stage 39.

The above-described process module 15 removes foreign matter adhered to the rear surface or the periphery of the wafer W using the cleaning agent. However, matter able to be removed is not limited to this and it is possible to remove other matter such as a residual photoresist that remains on the periphery of the wafer W.

In the above-described process module 15, pure water is used as the cleaning substance in the cleaning agent, but the cleaning substance is not limited to being pure water. For instance, an organic solvent (such as ethanol, methanol, ethylene glycol, or isopropyl alcohol), a surfactant or a cleaning solvent (such as SC1, SC2, BHF or DHF) may be used. Since the boiling points of these cleaning materials are comparatively low, and hence they can easily be in two phases of a gas phase and a liquid phase. Also, since these cleaning substances adhere easily to the foreign matter, it is possible to reliably reduce the attractive force such as the Van der Waal's force between the foreign matter and the wafer W. The ethylene glycol, in particular, has a composition which resembles that of polymer. Hence, when the main component of the foreign matter is polymer and ethylene glycol is used as the cleaning substance, the removal of the foreign matter occurs not only due to above described thermal stress and viscous force and the reduction of the Van der Waal's force but also due to elution of the foreign matter in the liquid-phase ethylene glycol. Consequently, it is possible to further promote removal of the foreign matter.

In the above-described process module 15, a nitrogen gas is used as the inert gas of the cleaning agent. However, from the standpoint of viscosity, the larger the molecular weight of the molecules composing the gas is the more preferable, and a gas such as argon gas or krypton gas may be used.

Since the process module 12 of the above-described substrate processing system 10 is the etching processing apparatus, etching processing is performed in the substrate processing system 10 either before or after the cleaning processing by the process module 15. Since the process module 15 is capable of completely removing the foreign matter adhered to the rear surface or the periphery of the wafer W, if the etching processing is performed after the cleaning processing, it is possible to prevent foreign matter from entering the process module 12 when the wafer W are transferred into the process module 12. Moreover, if the etching processing is performed before the cleaning processing, it is possible to prevent the foreign matter resulting from reaction products or polymers generated in the etching processing, from entering the process modules 13 and 14.

Note that the process module 12 may be an immersion lithography apparatus which performs lithography processing on the photoresist of the wafer W. In this case, the lithography processing on the photoresist is performed in the substrate processing system 10 after the cleaning processing by the process module 15. Since the process module 15 is capable of completely removing the foreign matter adhered to the rear surface or the periphery of the wafer W, it is possible both to prevent the wafer W from rising on the mounting stage in the immersion lithography apparatus and to prevent the foreign matter from mixing with the ultra pure water of the immersion lithography apparatus. It is therefore possible to perform the lithography accurately. The process module 12 may be a developer for performing coater/developer processing on the wafer W.

In the above-described process module 15, an ultrasonic vibration is applied to the cleaning agent. However, a high frequency vibration, of 0.1 MHz to 100 MHz for instance, may be applied in place of the ultrasonic vibration. The frequency of the fluctuation like pulse waves in the flow rate of the cleaning agent is preferably low so as to be effective in transmitting, by means of the pressure fluctuation, the physical shock to the foreign matter. A frequency of the order of 1 Hz is an example of a suitable frequency.

Figure 5:
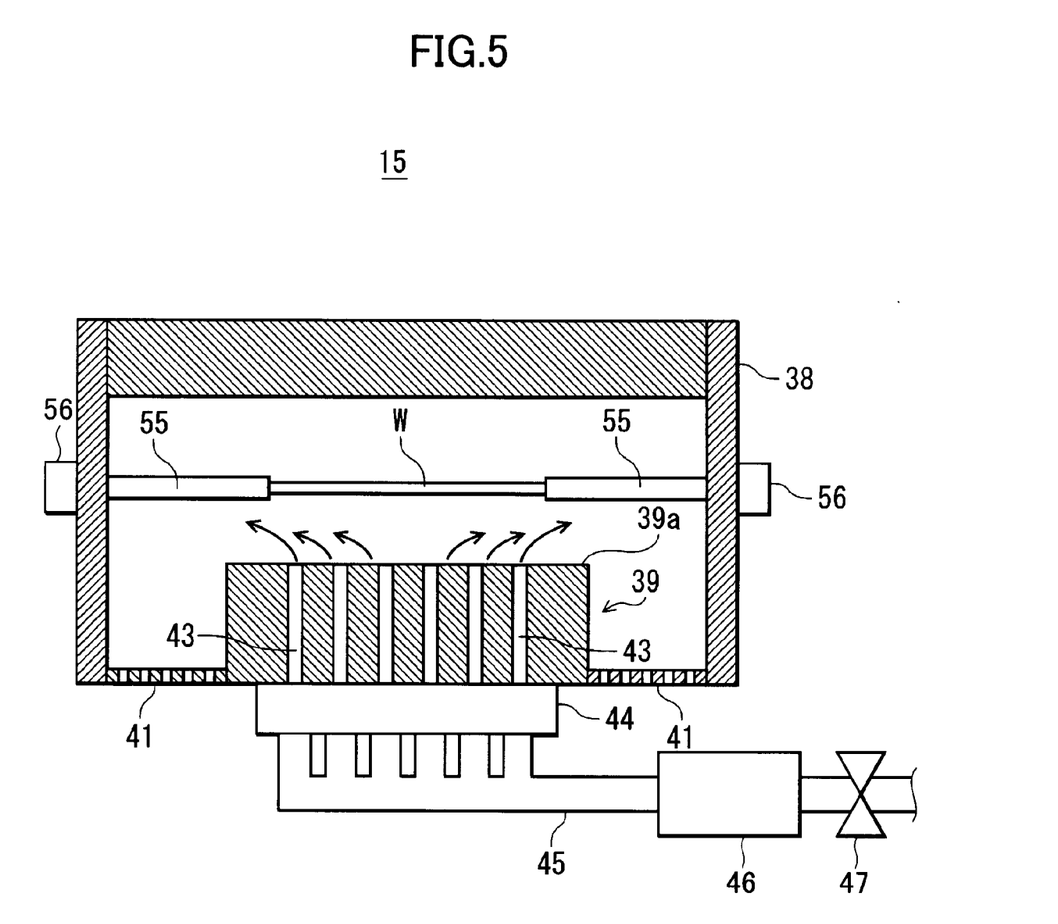
FIG. 5 is a cross-sectional view schematically showing the construction of a first variation of the process module in FIG. 2.

The above-described process module 15 includes the shower head 40. However, as shown in FIG. 5, the process module 15 may include an arm 55 (holding apparatus) for holding the wafer W in place of the shower head 40. The arm 55 is provided with a side-wall portion in the chamber 38 and holds the perimeter of the wafer W. With this arrangement, the wafer W can be reliably prevented from being moved, upwards for instance, by the cleaning agent jetted from the stage 39. In this case, the process module 15 may include an arm vibration applying apparatus 56 capable of applying a vibration to the arm 55. The arm vibration applying apparatus causes the wafer W to vibrate, making it possible to further promote removal of the foreign matter.

Figure 6:
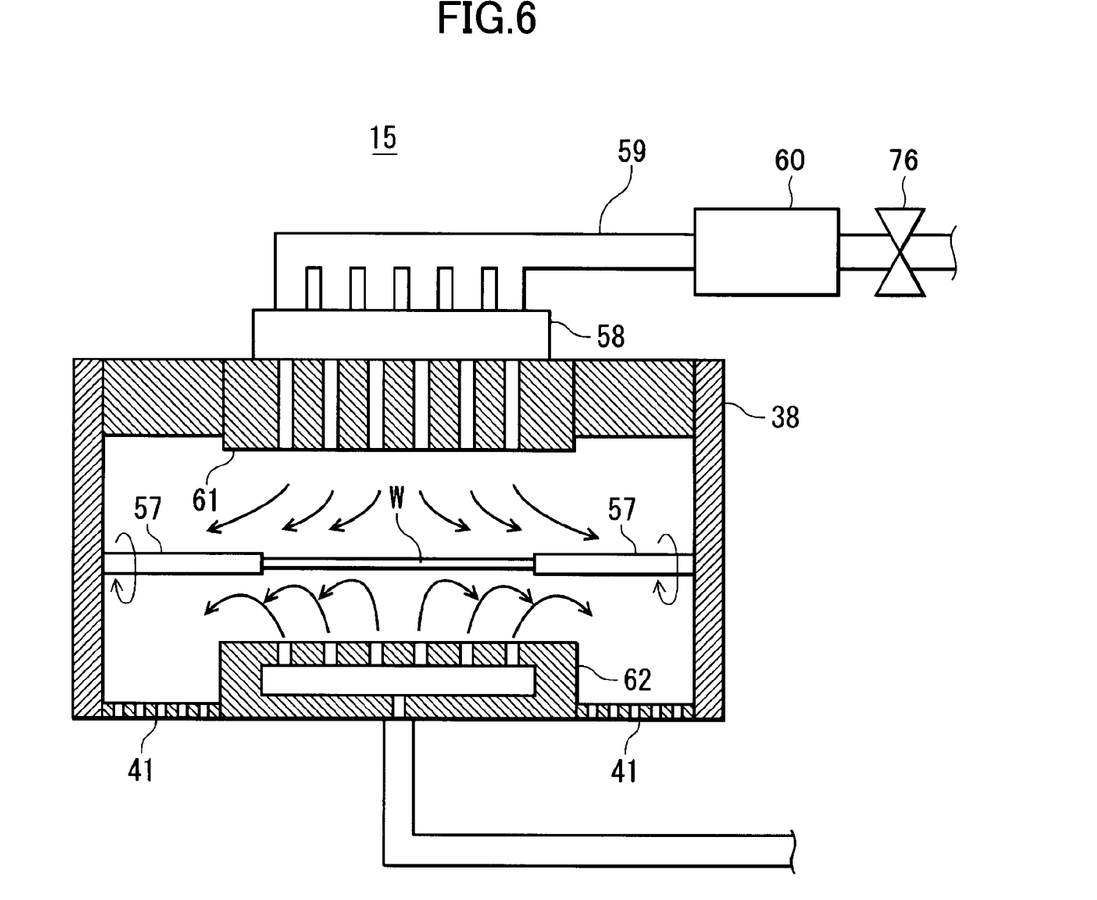
FIG. 6 is a cross-sectional view schematically showing the construction of a second variation of the process module of FIG. 2.

The process module 15 may include an arm 57 (holding apparatus) which holds the wafer W and reverses the front and rear surfaces of the wafer W in the manner shown in FIG. 6. In this case, the process module 15 includes a shower head 61 constructed in a similar manner to the stage 39 on the ceiling portion of the chamber 38. The shower head 61 is connected to the cleaning agent supplying apparatus (not shown) via a cleaning agent vibration applying apparatus 58, a cleaning agent supply pipe 59, a heater 60 and a pulse generator 76.

The shower head 61 jets a cleaning agent, which is a mixture of two-phase pure water and a high-temperature nitrogen gas, towards the front surface of the wafer W held by the arm 57. The arm 57 reverses the front and rear surfaces of the wafer W, and, when the rear surface of the wafer W is facing the shower head 61, the shower head 61 jets the cleaning agent towards the rear surface of the wafer W. With this arrangement, it is possible to remove the foreign matter not only from the rear surface but also from the front surface of the wafer W using the cleaning agent.

Moreover, in the process module 15 of FIG. 6, a stage 62 constructed in a similar manner to the shower head 40 may be provided on a bottom portion of the chamber 38. This arrangement allows argon gas to be jetted towards a surface of the wafer W opposing the surface towards which the cleaning agent is jetted. As a result, it is possible to prevent the removed foreign matter from moving around to the opposing surface and adhering thereto.

Figure 7A:
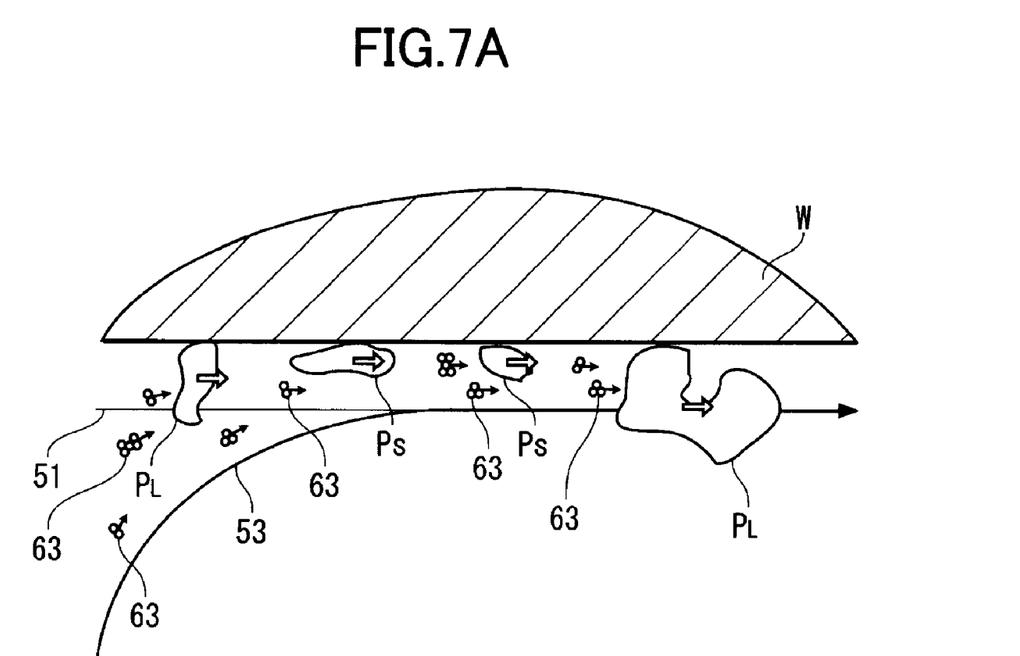
FIGS. 7A and 7B are views for describing variations for the removal of foreign matter in a present embodiment, FIG. 7A showing a case in which pure water in the gas phase alone and a high-temperature nitrogen gas are jetted as the cleaning agent, and FIG. 7B showing a manner in which comparatively small foreign matter is removed in the case shown in FIG. 7A.

In the above-described process module 15, the stage 39 jets the cleaning agent that is a mixture of the two-phase pure water and the high-temperature nitrogen gas towards the rear surface or the periphery of the wafer W. However, a cleaning agent that is a mixture of a pure water (cleaning substance) in the gas phase alone and the high-temperature nitrogen gas may be jetted. The pure water in the gas phase alone is assumed to include a plurality of clustered molecules. Here too, the boundary layer 51 is generated at the rear surface or the periphery of the wafer W as shown in FIG. 7A, and the jetted high-temperature nitrogen gas removes the comparatively large foreign matter PL of which a portion protrudes from the boundary layer 51 using the thermal stress and viscous force. Here, clustered water molecules 63 enter the boundary layer 51.

Figure 7B:
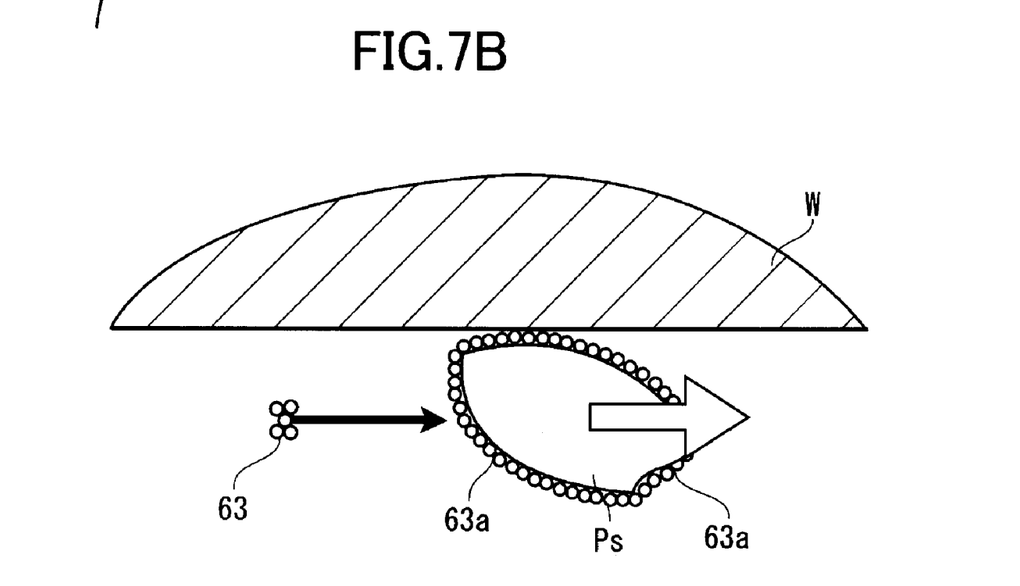

A portion of the clustered water molecules 63 entering the boundary layer 51 separate to form individual water molecules 63$a$ which adhere around the comparatively small foreign matter $P_S$ not protruding from the boundary layer 51 (FIG. 7B). When the water molecules 63$a$ adhere without intervals around the foreign matter $P_S$, the attractive force, such as the Van der Waal's force, between the atoms and molecules making up the wafer W and the atoms and molecules making up the foreign matter $P_S$ is reduced. As a result, it becomes easier to detach the foreign matter $P_S$ from the rear surface or the periphery of the wafer W. Of the clustered water molecules 63 entering the boundary layer 51, the portion not forming the fine water molecules 63$a$ collides with the foreign matter $P_S$, and thereby applies a physical shock to the foreign matter $P_S$.

With this arrangement, not only the comparatively large foreign matter $P_L$ protruding from the boundary layer 51 but also the comparatively small foreign matter $P_S$ not protruding from the boundary layer 51 can be removed in the same manner as the case in which the cleaning agent is made up of a mixture of the two-phase pure water and the high-temperature nitrogen gas. Hence, it is possible to completely remove the foreign matter adhered to the rear surface or the periphery of the wafer W.

The present arrangement resembles the arrangement in which the cleaning agent composed of a mixture of the two-phase pure water and the high-temperature nitrogen gas both in that, since a gas convection is generated in the boundary layer 51 although it is slight in the manner described above, even if the clustered water molecules 63 do not collide, the foreign matter $P_S$ covered without interval by the adhering water molecules 63$a$ is moved and removed by the convection, and in that the cleaning agent composed of a mixture of the pure water in the gas phase alone and the high-temperature nitrogen gas undergoes ultrasonic vibration so as to fluctuate the flow rate of the cleaning agent like pulse waves, which further promotes removal of the foreign matter.

Note that the arrangement also resembles the case in which the cleaning agent is a mixture of the two-phase pure water and the high-temperature nitrogen gas in that the cleaning substance included in the cleaning agent is not limited to being pure water but may be an organic solvent (such as ethanol, methanol, ethylene glycol, or isopropyl alcohol), a surfactant or a cleaning solution (such SC1, SC2, BHF, or DHF).

The following describes a substrate processing system according to a second embodiment of the present invention.

Since the substrate processing system according to the present embodiment differs from that of the first embodiment only in the construction of the process module which performs the cleaning processing on the rear surface or the periphery of the wafer W, the following describes the differing construction and functions while omitting descriptions of duplicated parts and functions.

Figure 8:
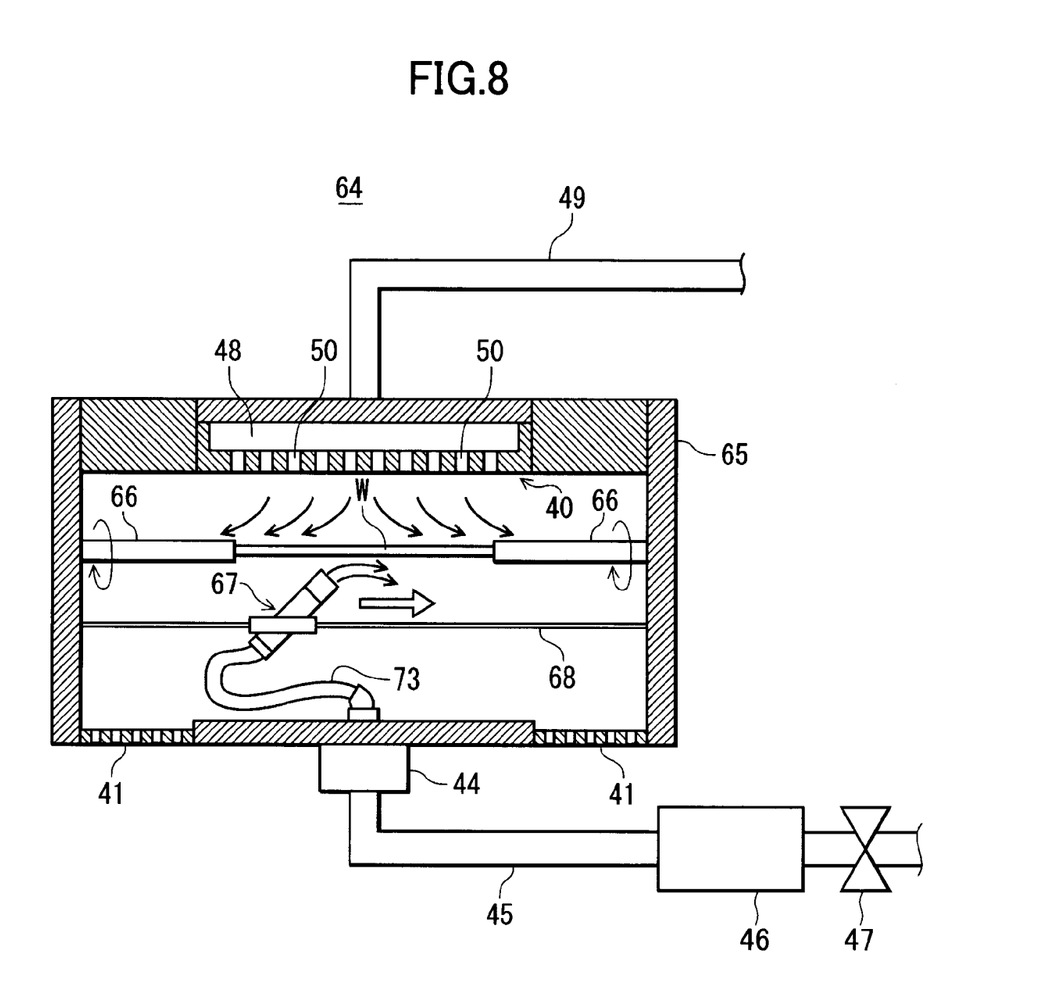
FIG. 8 is a cross-sectional view schematically showing a construction of a process module which is a substrate cleaning apparatus provided in a substrate processing system according to a second embodiment of the present invention.

FIG. 8 is a cross-sectional view schematically showing a construction of a process module which is a substrate cleaning apparatus provided in a substrate processing system of the present embodiment.

In FIG. 8, the process module 64 includes a chamber 65 housing a wafer W, an arm 66 arranged within the chamber 65 for holding the wafer W in a horizontal position, a cleaning agent jetting nozzle 67 arranged diagonally with respect to the rear surface of the held wafer W, a shower head 40 arranged on a ceiling portion in the chamber 65 and facing a front surface of the wafer W, and an exhaust opening 41 for exhausting gas from inside the chamber 65.

Since the cleaning agent jetting nozzle 67 moves (in a direction shown by the outline arrows) along a guide rail 68 disposed horizontally in the chamber 65, the cleaning agent jetting nozzle 67 and the wafer W move in parallel relative to each other.

Figure 9A:
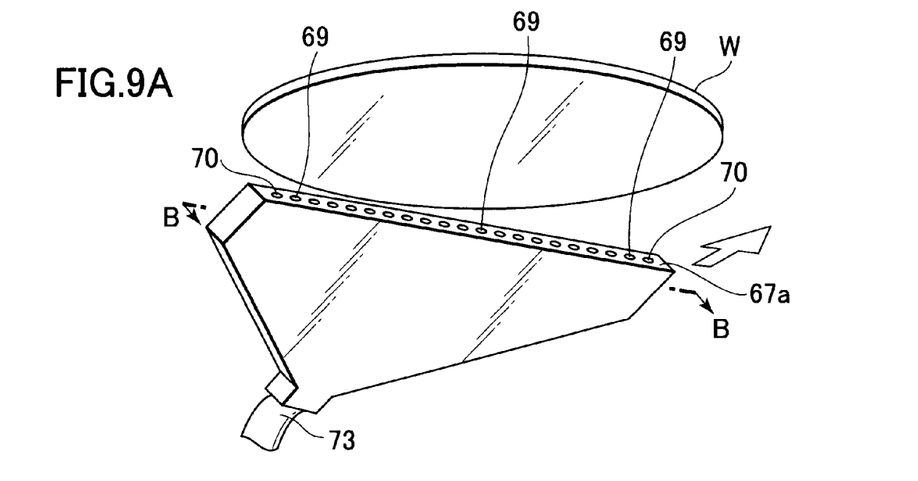
FIGS. 9A to 9C are views schematically showing a construction of a cleaning agent jetting nozzle in FIG. 8, FIG. 9A showing a positional relationship between a wafer and the cleaning agent emitting nozzle, FIG. 9B being a cross-sectional view along B-B in FIG. 9A, and FIG. 9C being an enlargement of the portion C in FIG. 9B.
Figure 9B:
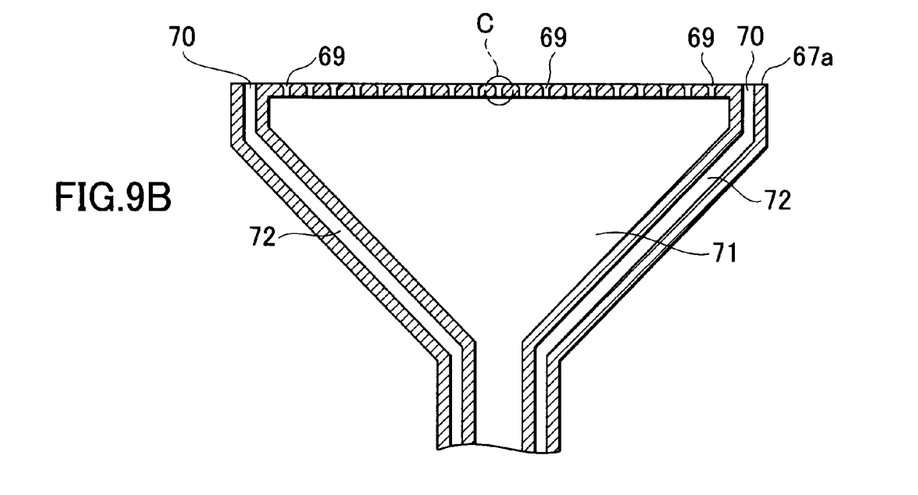
Figure 9C:
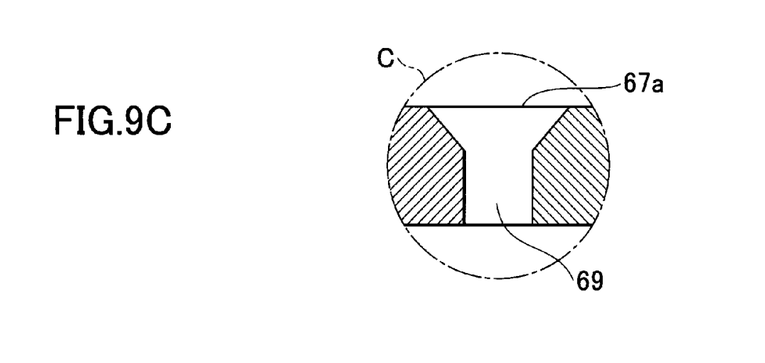

FIGS. 9A to 9C are views schematically showing the construction of the cleaning agent jetting nozzle in FIG. 8. FIG. 9A shows the positional relationship between the wafer and the clearing agent jetting nozzle. FIG. 9B is a cross-sectional view along a line B-B in FIG. 9A, and FIG. 9C is an enlargement of a portion C in FIG. 9B.

As shown in FIG. 9A, the cleaning agent jetting nozzles 67 is made up of a spatula-shaped member having an opposing surface 67a that diagonally opposes the rear surface of the wafer W in a leading edge. A plurality of cleaning agent jetting holes 69 open in the opposing surface 67a. The cleaning agent is jetted from the cleaning agent jetting holes 69. Since the opposing surface 67a extends in an orthogonal direction to the direction in which the cleaning agent jetting nozzle 67 moves (shown by the outline arrows in the drawings) and has an orthogonal direction length which is at least the diameter of the wafer W, the cleaning agent jetting nozzles 67 can scan across the entire rear surface of the wafer W with the cleaning agent jetted from the cleaning agent jetting holes 69. The opposing surface 67a includes a plurality of duct holes 70 (intake duct portion). Hence, the duct holes 70 face towards the rear surface of the wafer W. The duct holes 70 suck in the foreign matter removed from the rear surface or the periphery of the wafer W together with the cleaning agent.

As shown in FIG. 9B, the cleaning agent jetting nozzle 67 has a buffer portion 71 which communicates internally with the cleaning agent jetting holes 69 and intake ports 72 which communicate with the duct holes 70. The intake ports 72 communicate with a suction apparatus (not shown). Further, as shown in FIG. 9C, the portion of each cleaning agent jetting hole 69 at the opposing surface 67a is formed to have a flared-shape. Hence, the cleaning agent jetting holes 69 can jet the cleaning agent evenly towards the rear surface or the periphery of the wafer W.

Referring again to FIG. 8, the cleaning agent jetting holes 69 of the cleaning agent jetting nozzle 67 communicate with the cleaning agent supply pipe 45 via the buffer portion 71, a flexible pipe 73 and the cleaning agent vibration applying apparatus 44 (another vibration applying apparatus). The cleaning agent supply pipe 45 is connected to the cleaning agent supplying apparatus (not shown) via the heater 46 and the pulse generator 47. The buffer chamber 48 of the shower head 40 communicates with the inside of the chamber 65 via a plurality of through holes 50.

The cleaning agent supplying apparatus of the present embodiment also supplies a cleaning agent which is a mixture of a cleaning substance in the two phases of a liquid phase and a gas phase, such as pure water and an inert gas such as nitrogen gas, to the buffer portion 71 via the heater 46, the cleaning agent supply pipe 45, the cleaning agent vibration applying apparatus 44, and the flexible pipe 73. The cleaning agent supplied to the buffer portion 71 is further jetted towards the rear surface or the periphery of the wafer W via the cleaning agent jetting holes 69. Hence, the cleaning agent jetting nozzle 67 functions as a cleaning agent jetting apparatus. The present arrangement resembles that of the first embodiment in that the comparatively large foreign matter $P_L$ is removed from the rear surface or the periphery of the wafer W by the thermal stress or viscous force of the high-temperature nitrogen gas and the comparatively small foreign matter $P_S$ for which the Van der Waal's force have been reduced by the adhering pure water particles is removed by the collisions with the pure water.

The present arrangement further resembles that of the first embodiment in that a down-flow from the shower head 40 to the wafer W is generated, thereby preventing foreign matter from adhering to the front surface of the wafer W.

Moreover, since the cleaning agent jetting holes 69 in the cleaning agent jetting nozzle 67 are arranged in the opposing surface 67a that diagonally opposes to the rear surface of the wafer W, the cleaning agent jetting nozzle 67 jets the cleaning agent diagonally with respect to rear surface of the wafer W.

Figure 10:
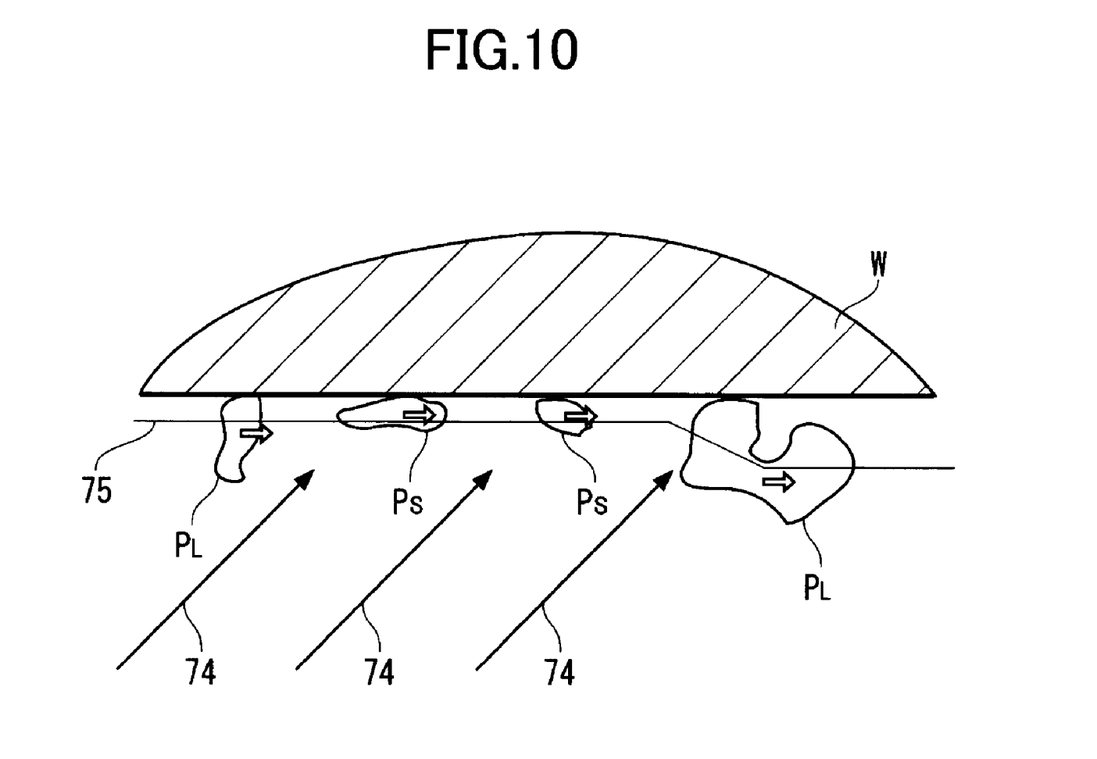
FIG. 10 is a view for describing the removal of foreign matter in a present embodiment.

Since the diagonally jetted cleaning agent 74 pushes the boundary layer 75 along the rear surface of the wafer W as shown in FIG. 10, it is possible to expose the comparatively small foreign matter $P_S$ from the boundary layer 75. Hence, the thermal stress and viscous force from the high-temperature nitrogen gas also act on the comparatively small foreign matter $P_S$ and the foreign matter $P_S$ can be reliably removed.

Note that when the cleaning agent are simultaneously jetted towards the entire rear surface of the wafer W, there is a tendency that the removed foreign matter will join the flow of the cleaning agent, be pressed against the rear surface of the wafer W again, and re-adhere thereto. In the process module 64, however, the cleaning agent jetting nozzle 67 and the wafer W move in parallel relative to each other, and the cleaning agent are therefore never simultaneously jetted towards the entire rear surface of the wafer W. Hence, the removed foreign matter is not pressed against the rear surface or the periphery of the wafer W again. Also, as described above, the duct holes 70 suck in the foreign matter removed from the rear surface or the periphery of the wafer W together with the cleaning agent. As a result, the foreign matter can be reliably prevented from re-adhering to the rear surface or the periphery of the wafer W.

Note that the cross-sectional profile of the cleaning agent jetting holes 69 in the cleaning agent jetting nozzle 67 are not limited to the circular form shown in FIG. 9A, and may be triangular, square, or star-shaped.

The arm 66 may reverse the front and rear surfaces of the wafer W. This allows the foreign matter to be removed not only from the rear surface of the wafer W but also from the front surface of the wafer W.

Although the process module, which is the substrate cleaning apparatus, is included in the substrate processing system 10 in the above-described embodiments, the process module which is the substrate cleaning apparatus may be provided independently rather than being included in the substrate processing system 10.

Moreover, although the substrate undergoing the cleaning processing is a semiconductor wafer in the above-described embodiments, the substrate is not limited to being a semiconductor wafer, and may be a glass substrate such of an LCD (Liquid Crystal Display), an FPD (Flat Panel Display), or the like.

What is claimed is:

1. A substrate processing system comprising:
   a substrate processing apparatus configured to perform predetermined processing on a substrate;
   a cleaning agent supply apparatus configured to hold a cleaning agent; and
   a substrate cleaning apparatus configured to clean the substrate at least one of before and after the predetermined processing,
   wherein said substrate cleaning apparatus includes a jetting apparatus configured to jet a same single substance in two phases of a gas phase and a liquid phase with a high-temperature gas towards a rear surface or a periphery of the substrate, and
   wherein the same single substance is an organic solvent or a surfactant that is held in the cleaning agent supply apparatus and supplied to the jetting apparatus.

2. A substrate processing system as claimed in claim 1, wherein said jetting apparatus jets the same single substance and the high-temperature gas diagonally with respect to the rear surface of the substrate.

3. A substrate processing system as claimed in claim 1, wherein said jetting apparatus and the substrate move in parallel relative to each other.

4. A substrate processing system as claimed in claim 3, wherein said jetting apparatus is made up of a spatula-shaped member having an opposing surface that opposes the rear surface of the substrate in a leading edge thereof, and wherein a plurality of same single substance jetting holes open in the opposing surface.

5. A substrate processing system as claimed in claim 4, wherein the substrate has a circular plate shape, and wherein the opposing surface extends in an orthogonal direction to a direction in which said jetting apparatus moves and has an orthogonal direction length which is at least the diameter of the substrate.

6. A substrate processing system as claimed in claim 4, wherein a cross-sectional profile of the same single substance jetting holes in said jetting apparatus is triangular, square or star-shaped.

7. A substrate processing system as claimed in claim 1, wherein said jetting apparatus includes an intake duct portion that opens towards the rear surface of the substrate.

8. A substrate processing system as claimed in claim 1, wherein said substrate cleaning apparatus has another jetting apparatus configured to jet another gas towards a front surface of the substrate.

9. A substrate processing system as claimed in claim 8, wherein a flow amount of a down-flow from said other jetting apparatus is set to be larger than a flow amount of the same single substance and the high-temperature gas jetted from said jetting apparatus.

10. A substrate processing system as claimed in claim 1, wherein said substrate cleaning apparatus includes a holding apparatus configured to hold the substrate.

11. A substrate processing system as claimed in claim 10, wherein said holding apparatus turns the substrate over.

12. A substrate processing system as claimed in claim 10, wherein said substrate cleaning apparatus includes a vibration applying apparatus configured to apply a vibration to said holding apparatus.

13. A substrate processing system as claimed in claim 1, wherein said substrate cleaning apparatus includes a vibration applying apparatus configured to apply a vibration to the same single substance and the high-temperature gas.

14. A substrate processing system as claimed in claim 13, wherein said vibration applying apparatus applies an ultrasonic vibration to the same single substance and the high-temperature gas.

15. A substrate processing system as claimed in claim 13, wherein said vibration applying apparatus applies a high frequency vibration, of 0.1 MHz to 100 MHz, to the same single substance and the high-temperature gas.

16. A substrate processing system as claimed in claim 1, wherein said substrate cleaning apparatus includes a flow rate fluctuating apparatus configured to cause fluctuation like pulse waves in flow rates of the same single substance and the high-temperature gas.

17. A substrate processing system as claimed in claim 1, wherein the predetermined processing is etching processing.

18. A substrate processing system as claimed in claim 1, wherein the predetermined processing is lithography processing of a photoresist or coater/developer processing.

19. A substrate processing system as claimed in claim 1, wherein a temperature of the high-temperature gas is from 80° C. to 150° C.

20. A substrate cleaning apparatus comprising:
a cleaning agent supply apparatus configured to hold a cleaning agent; and
a jetting apparatus configured to jet a same single substance in two phases of a gas phase and a liquid phase with a high-temperature gas towards a rear surface or a periphery of a substrate,
wherein the same single substance is an organic solvent or a surfactant that is held in the cleaning agent supply apparatus and supplied to the jetting apparatus.

* * * * *